United States Patent
Miyahara et al.

(10) Patent No.: US 10,304,676 B2
(45) Date of Patent: May 28, 2019

(54) METHOD AND APPARATUS FOR FORMING NITRIDE FILM

(71) Applicant: TOKYO ELECTRON LIMITED, Tokyo (JP)

(72) Inventors: Takahiro Miyahara, Nirasaki (JP); Daisuke Suzuki, Nirasaki (JP); Hiroki Murakami, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/660,394

(22) Filed: Jul. 26, 2017

(65) Prior Publication Data

US 2018/0033608 A1  Feb. 1, 2018

(30) Foreign Application Priority Data

Aug. 1, 2016  (JP) .................................. 2016-150985

(51) Int. Cl.
*C23C 16/02*    (2006.01)
*C23C 16/04*    (2006.01)
(Continued)

(52) U.S. Cl.
CPC ...... *H01L 21/0228* (2013.01); *C23C 16/0236* (2013.01); *C23C 16/0272* (2013.01);
(Continued)

(58) Field of Classification Search
CPC ........... H01L 21/0228; H01L 21/31116; H01L 21/0217; H01L 21/285; H01L 21/02312; H01L 21/02211; C23C 16/34; C23C 16/4412; C23C 16/45525; C23C 16/46; C23C 16/52; C23C 16/345; C23C 16/45578; C23C 16/45551; C23C 16/45546; C23C 16/45542; C23C 16/45544; C23C 16/0236; C23C 16/0272
See application file for complete search history.

(56) References Cited

U.S. PATENT DOCUMENTS

| 6,169,032 B1* | 1/2001 | Murakami .............. C23C 16/34 |
| | | 257/E21.584 |
| 2012/0219710 A1* | 8/2012 | Morozumi .............. C23C 16/34 |
| | | 427/248.1 |
| 2017/0103885 A1* | 4/2017 | Nakamura .............. C23C 16/02 |

FOREIGN PATENT DOCUMENTS

| JP | 2000-174007 A | 6/2000 |
| JP | 2004-281853 A | 10/2004 |

* cited by examiner

*Primary Examiner* — Jasmine J Clark
(74) *Attorney, Agent, or Firm* — Nath, Goldberg & Meyer; Jerald L. Meyer

(57) ABSTRACT

A method for forming a nitride film is provided. The method includes preparing a substrate to be processed, the substrate having a first base film formed of a material having a relatively long incubation time and a second base film formed of a material having a relatively short incubation time with respect to a nitride film, forming a nitride film on the substrate by means of ALD or CVD using a raw material gas and a nitriding gas while heating the substrate to a predetermined temperature, and etching nitride on the first base film to be removed by supplying an etching gas to thereby expose a film surface of the first base film, wherein the forming the nitride film and the etching the nitride are repeatedly performed a predetermined number of times to selectively form the nitride film on the second base film.

24 Claims, 14 Drawing Sheets

(51) Int. Cl.
  *C23C 16/34*     (2006.01)
  *C23C 16/44*     (2006.01)
  *C23C 16/46*     (2006.01)
  *C23C 16/52*     (2006.01)
  *C23C 16/56*     (2006.01)
  *H01L 21/02*     (2006.01)
  *H01L 21/32*     (2006.01)
  *H01L 29/49*     (2006.01)
  *H01L 29/66*     (2006.01)
  *C23C 16/455*    (2006.01)
  *H01L 21/285*    (2006.01)
  *H01L 21/311*    (2006.01)

(52) U.S. Cl.
  CPC .............. *C23C 16/04* (2013.01); *C23C 16/34* (2013.01); *C23C 16/345* (2013.01); *C23C 16/4412* (2013.01); *C23C 16/45534* (2013.01); *C23C 16/45542* (2013.01); *C23C 16/45544* (2013.01); *C23C 16/45546* (2013.01); *C23C 16/45551* (2013.01); *C23C 16/45578* (2013.01); *C23C 16/46* (2013.01); *C23C 16/52* (2013.01); *C23C 16/56* (2013.01); *H01L 21/0217* (2013.01); *H01L 21/02211* (2013.01); *H01L 21/02271* (2013.01); *H01L 21/285* (2013.01); *H01L 21/31116* (2013.01); *H01L 21/32* (2013.01); *H01L 29/4983* (2013.01); *H01L 21/02312* (2013.01); *H01L 29/66553* (2013.01)

Initial stage of film formation

After continuous film formation

US 10,304,676 B2

METHOD AND APPARATUS FOR FORMING NITRIDE FILM

CROSS-REFERENCE TO RELATED APPLICATION

This application is based upon and claims the benefit of priority from Japanese Patent Application No. 2016-150985, filed on Aug. 1, 2016, the entire contents of which are incorporated herein by reference.

TECHNICAL FIELD

The present disclosure relates to a method and apparatus for forming a nitride film, such as a silicon nitride film, etc.

BACKGROUND

The manufacturing sequence of a semiconductor device includes a film forming process of forming a nitride film, such as a silicon nitride film (SiN film) or the like, as an insulation film, on a semiconductor wafer, namely, a silicon wafer. Chemical vapor deposition (CVD) is widely used in a SiN film forming process.

Recently, in terms of improving properties along with the progress of miniaturization and high integration of a semiconductor device, a method of forming a SiN film by sequentially supplying gases, such as atomic layer deposition (ALD), which is capable of forming a high-quality film at a temperature lower than that in conventional CVD, has been conducted. In case of forming a SiN film by ALD, a SiN film having a predetermined thickness is formed by repeating the following steps a predetermined number of times: adsorbing a Si raw material onto a substrate to be processed; and subsequently supplying a nitriding gas to react with the Si raw material, thereby forming SiN at an atomic layer or at a molecular layer level.

As a method of forming a SiN film by means of ALD, there has been proposed a technology for alternately supplying a dichloro silane (DCS; $SiH_2Cl_2$) gas as a Si raw material gas and an ammonia ($NH_3$) gas as a nitriding gas, wherein plasma is generated by applying high-frequency power when supplying the $NH_3$ gas, thereby accelerating nitriding reaction.

Furthermore, since the configuration of an apparatus becomes complicated when using plasma, forming a SiN film by sequentially supplying gases without using plasma, as in thermal ALD, has been considered.

However, when growing the nitride film such as an SiN film on a structure in which two or more types of different base films are exposed by ALD or CVD, it has been necessary to selectively grow the nitride film on a specific base film.

SUMMARY

Some embodiments of the present disclosure provide a method and an apparatus of forming a nitride film which is capable of selectively forming a film according to a base film.

According to one embodiment of the present disclosure, there is provided a method for forming a nitride film is provided. The method includes preparing a substrate to be processed, the substrate having a first base film formed of a material having a relatively long incubation time and a second base film formed of a material having a relatively short incubation time with respect to a nitride film, forming a nitride film on the substrate by means of ALD or CVD using a raw material gas and a nitriding gas while heating the substrate to a predetermined temperature, and etching nitride on the first base film to be removed by supplying an etching gas to thereby expose a film surface of the first base film, wherein the forming the nitride film and the exposing the film surface are repeatedly performed a predetermined number of times to selectively form the nitride film on the second base film.

According to another embodiment of the present disclosure, there is provided an apparatus for selectively forming a nitride film on a second base film of a substrate to be processed, the substrate having a first base film formed of a material having a relatively long incubation time and the second base film formed of a material having a relatively short incubation time with respect to the nitride film. The apparatus includes a process chamber in which the substrate is accommodated, a gas supply mechanism which supplies a raw material gas, a nitriding gas, and an etching gas into the process chamber, and a heating device that heats a plurality of substrates accommodated in the process chamber, an exhaust device which exhausts an inside of the process chamber, and a controller that performs a control for disposing the substrate within the process chamber, forming the nitride film on the substrate by means of ALD or CVD by supplying a raw material gas and a nitriding gas into the process chamber while heating the substrate to a predetermined temperature, subsequently etching nitride on the first base film to be removed by supplying an etching gas to thereby expose a film surface of the first base film, and repeating the forming the nitride film and the etching the nitride a predetermined number of times.

According to another embodiment of the present disclosure, there is provided a non-transitory storage medium storing a program executed in a computed and for controlling an apparatus for forming a nitride film. The program is executed to control the apparatus for forming the nitride film to perform the aforementioned method of forming the nitride film.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Background that Led to the Present Disclosure

In general, when forming a SiN film by means of thermal ALD or CVD, a substrate to be processed is accommodated in a process chamber and heated to a predetermined temperature, and then a DCS gas as a Si raw material gas and a $NH_3$ gas as a nitriding gas are sequentially and repeatedly supplied a predetermined number of times, or simultaneously supplied, thereby forming a SiN film having a predetermined film thickness on the surface of the substrate.

When forming a SiN film by means of ALD or CVD, especially, in case of forming a SiN film by means of thermal ALD, initial incubation times are different from each other according to base films when the SiN film is formed thereon, and thus a starting time of the film formation is varied. Due to this, selective film formation is possible before the film formation starts on one base film after the film formation starts on the other base film.

Figure 1A:
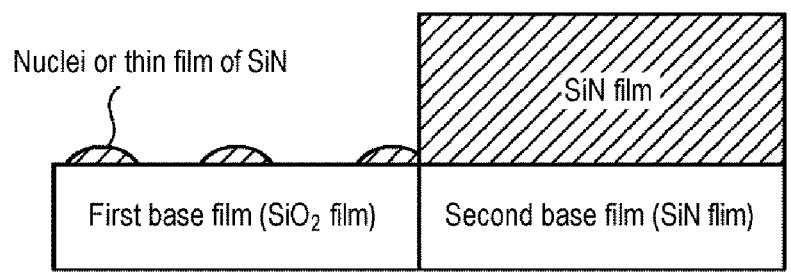
FIGS. 1A and 1B are views for explaining a state in which a SiN film is formed on a first base film formed of a $SiO_2$ film and on a second base film formed of a SiN film through ALD or CVD.

For example, in the case where base films are a SiN film and a thermal oxide film (a $SiO_2$ film), since incubation time in forming the SiN film on a side of the SiN film is shorter, the film formation on the SiN film starts earlier by the incubation time difference. Thus, since the SiN film is selectively formed only on the SiN film until the film formation starts on the $SiO_2$ film at an initial film formation, nuclei of SiN merely exist on the $SiO_2$ film, as illustrated in FIG. 1A.

Figure 1B:
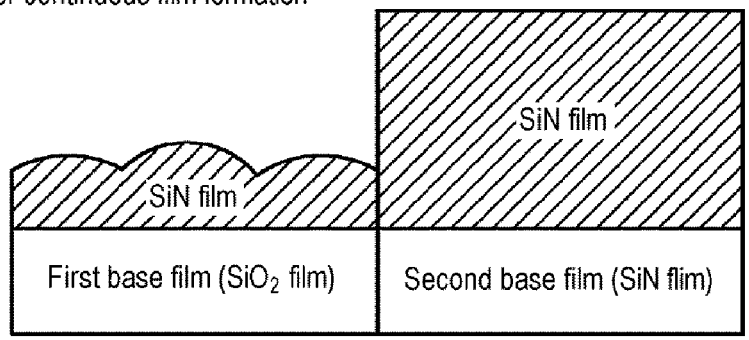

However, in the selective film formation using the incubation time difference caused due to the unique natures of the base films, when the film formation continues subsequently, a nitride film is eventually formed on the $SiO_2$ film, as illustrated in FIG. 1B. As a result, the selective film formation is not valid anymore, so that thickness of the film that can be formed by the selective film formation is slight.

Therefore, as a result of further examination, in case of forming the SiN film on two or more types of base films, for example, in case of forming the SiN film on the SiN film on which the film formation starts quickly and on the $SiO_2$ film on which the film formation starts slowly, it is found that, after the film formation starts, it is effective to cause film formation delay on the $SiO_2$ film by removing SiN on the $SiO_2$ film. When SiN is attached to the $SiO_2$ film in the form of an initial nuclei prior to becoming a SiN film on the $SiO_2$ film or when SiN is formed in a thin film shape, the SiN on the $SiO_2$ film is removed by an etching action, thereby exposing again the surface of the $SiO_2$ film on which the film formation starts slowly.

Figure 2A:
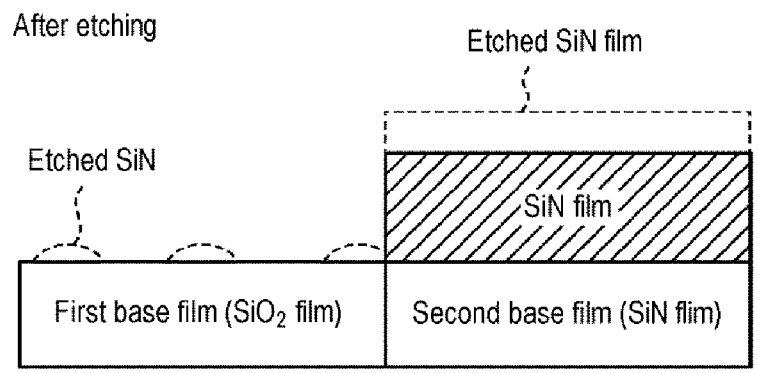
FIGS. 2A and 2B are views for explaining a principle to selectively form SiN film on a second base film of a substrate that has a first base film formed of a $SiO_2$ film and the second base film formed of a SiN film.
Figure 2B:
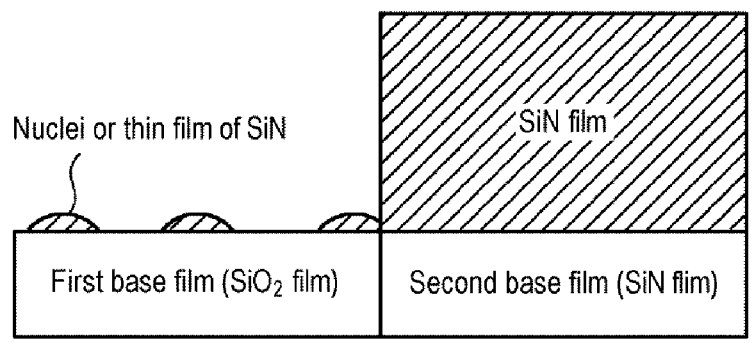

That is, in the case where there are provided, as the base films, a SiN film on which the film formation starts quickly on account of a short incubation time in forming a nitride film and a $SiO_2$ base film on which the film formation starts slowly on account of a long incubation time in forming the nitride film, a SiN film is selectively formed only on the SiN film at the initial film formation, and SiN on the $SiO_2$ film is removed by the etching action when SiN is attached to the $SiO_2$ film in the form of initial nuclei (or SiN is formed in a thin film shape), as illustrated in FIG. 1A, thereby exposing again the surface of the $SiO_2$ film on which the film formation starts slowly, as illustrated in FIG. 2A. As such, a state that the SiN film is not formed can be caused again. Meanwhile, when the etching is performed, the SiN film formed on the SiN film, which is another base film, is also etched, but since the SiN film formed on the SiN film is thicker than that formed on the $SiO_2$ base film, the SiN film having a certain film thickness remains on the SiN film after the etching. And then, by performing the film formation of a SiN film again, the SiN film is selectively formed on the SiN base film, as illustrated in FIG. 2B.

Accordingly, a relatively thick SiN film can be selectively formed on one side of the base films by repeating the film formation and the etching.

<Nitride Film Forming Method>

Hereinafter, a nitride film forming method of the present disclosure will be described. It will herein be exemplified that a SiN film is formed as a nitride film.

First Embodiment

Figure 3:
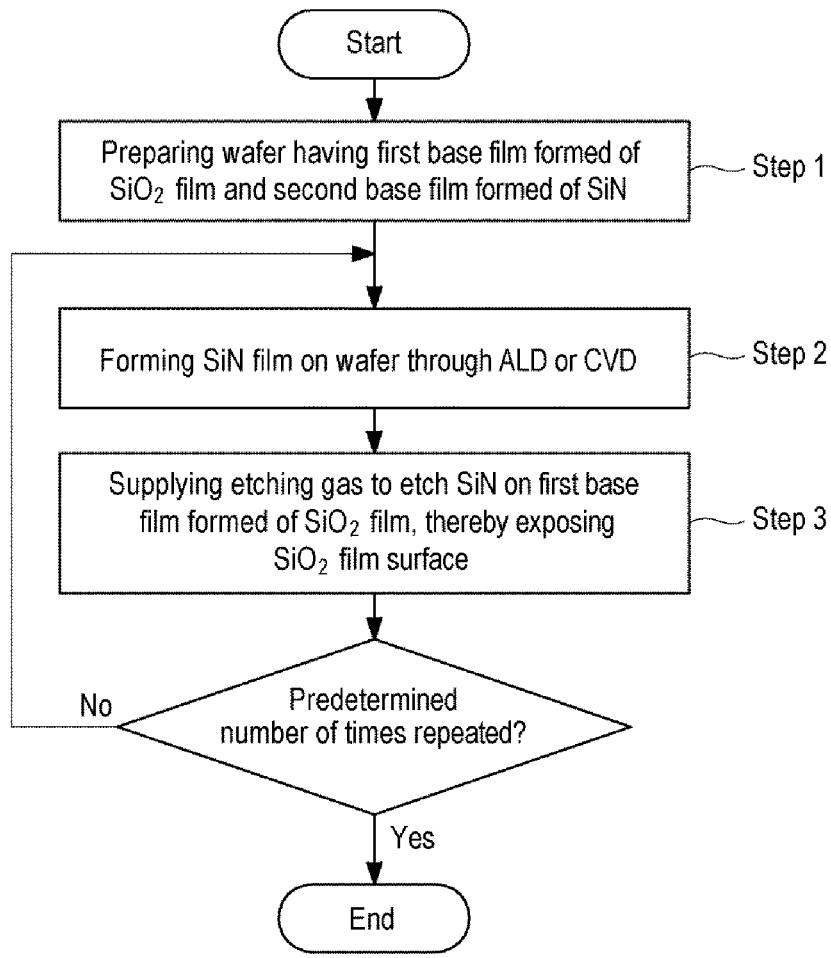
FIG. 3 is a flowchart illustrating a first embodiment of a nitride film forming method.

FIG. 3 is a flowchart illustrating a first embodiment of the nitride film forming method.

Figure 4:
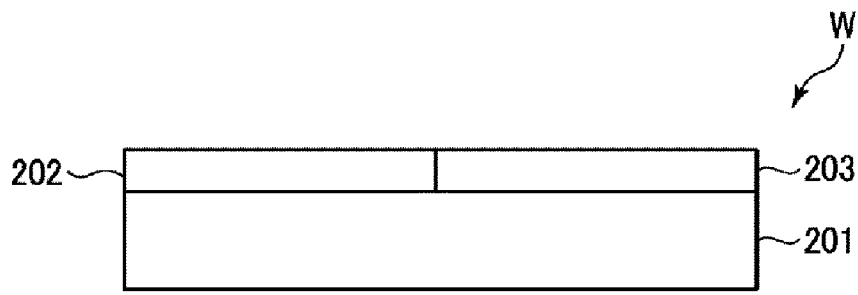
FIG. 4 is a view schematically illustrating a structure of a substrate to be processed.

First, a semiconductor wafer W (hereinafter, simply referred to as the wafer) that has a first base film 202 and a second base film 203 formed on a semiconductor substrate 201, as schematically illustrated in FIG. 4, is prepared as a substrate to be processed (Step S1).

The first base film 202 and the second base film 203 are formed of, for example, oxide, nitride, carbon nitride or the like. The first base film 202 and the second base film 203 are materials having incubation times different from each other when a SiN film is formed thereon. For example, the first base film 202 is a thermal oxide film ($SiO_2$ film) having a relatively long incubation time, and the second base film 203 is a SiN film having a relatively short incubation time.

Next, the film formation of the SiN film starts by ALD or CVD using a Si raw material gas, for example, a DCS gas, and a nitriding gas, for example, a $NH_3$ gas, is performed on the wafer W in which the first and second base films 202 and 203 are formed (Step S2). At this time, since the incubation time of the second base film 203 formed of the SiN film is shorter than that of the first base film 202 formed of the $SiO_2$ film, the film formation of the SiN on the second base film 203 starts earlier.

In the initial stage of the film formation, the SiN film is formed on the second base film 203 formed of a SiN film, and an etching gas is supplied when SiN is attached to the first base film 202, which is formed of a $SiO_2$ film, in the form of initial nuclei before the SiN becomes a film, or when SiN is formed in a thin film shape, to remove SiN on the first base film 202 formed of the $SiO_2$ film by an etching action of the etching gas, thereby exposing the $SiO_2$ film surface (Step S3). At this time, the SiN film on the second base film 203 formed of a SiN film is also etched. However, the SiN film may remain on the second base film 203 since the SiN film on the second base film 203 is thicker than the SiN on the first base film 202.

By repeating the SiN film forming step (Step S2) and the etching step (Step S3), a relatively thick SiN film may be selectively formed on the second base film 203.

While ALD or CVD may be used to form the SiN film in Step S2, as described above, ALD is desirably used so as to selectively form the SiN film according to a difference in incubation time. That is, in case of using ALD to form the SiN film, a Si raw material gas and a nitriding gas are alternately and repeatedly supplied, and thus the Si raw material gas may be adsorbed onto the base films, whereby it is possible to directly exhibit the degree of adsorption of the Si raw material gas according to the base films. In the case of ALD, it is preferable to supply a Si raw material gas first.

In case of performing the film formation of the SiN film in Step S2 through ALD, a step of supplying a Si raw material gas and a step of supplying a nitriding gas are repeated, and after each step is completed, a process of removing the residue of the gas used in each of the steps from the wafer W, for example, a purge, is performed. This process may be performed using an inert gas, such as a $N_2$ gas, an Ar gas, or the like. Furthermore, the process of removing the gas is appropriately set by a film forming apparatus, as will be described later.

In case of performing the film formation of the SiN film in Step S2 through ALD, thermal ALD that does not use plasma is specially used. However, in the step of supplying a nitriding gas, the nitriding gas may be decomposed by plasma. Accordingly, it is possible to form the SiN film at a lower temperature.

In case of performing the film formation of the SiN film in Step S2 through ALD, the film forming temperature may range from 400 to 650 degrees C. Specifically, the film forming temperature may range from 500 to 650 degrees C. Furthermore, the process pressure may range from 0.1 to 5 Torr (13.3 to 667 Pa). In the case of causing plasma with a nitriding gas, the film forming temperature may specifically range from 450 to 630 degrees C.

In case of performing the film formation of the SiN film in Step S2 through CVD, the film forming temperature may range from 600 to 800 degrees C. Specifically, the film forming temperature may range 700 to 780 degrees C. Furthermore, the process pressure may be the same range as that in the case of ALD.

As the Si material that can be used to form the SiN film, a chlorine-containing silane compound, such as the aforementioned DCS, monochloro silane (MCS; $SiClH_3$), trichloro silane (TCS; $SiHCl_3$), silicon tetrachloride (STC; $SiCl_4$), hexachloro disilane (HCD; $Si_2Cl_6$), etc., a silane compound, such as monosilane ($SiH_4$), disilane ($Si_2H_6$), etc., and an organosilane-based compound, such as an aminosilane-based compound, etc., may be used.

As the nitriding gas that can be used to form the SiN, a hydrazine ($N_2H_4$) gas and a derivative thereof, for example, a monomethyl hydrazine (MMH) gas, etc., other than the aforementioned $NH_3$ gas, may be used.

As etching gas that can be used in an etching process of the SiN, any gas capable of etching the SiN may be used but it may be desirable to have difficulty in etching the first base film 202 (Step S3).

For example, in the case where the first base film 202 is a $SiO_2$ film and the second base film 203 is a SiN film, a method of etching the SiN using a fluorine-based gas may be adopted by protecting the $SiO_2$ film with an oxidizing atmosphere or a block phase (carbon) having good compatibility with oxygen. In this case, the following gases (1) to (3) may be appropriately used as an etching gas.

(1) $F_2+O_2(+HF)(+C_xH_y)$ (x being an integer of 1 or more and y being an integer of 2 or more)
This gas system basically protects the $SiO_2$ film by means of an $O_2$ gas and etches the Si (SiN) by means of a $F_2$ gas. In the case where the SiN is not sufficiently etched only by the $F_2$ gas, HF may be added to enhance etching performance. Furthermore, a hydrocarbon-based compound, such as $C_xH_y$, etc., (specifically having a double or triple bond of C in the structure) may be introduced to enhance the protection of the $SiO_2$ film. A different oxidizing gas, for example, $O_3$, NO, $N_2O$, etc. may be used instead of the $O_2$ gas. Furthermore, $C_2H_2$, $C_2H_4$, $C_3H_6$, $C_5H_8$ or the like may be used as $C_xH_y$.

(2) $CH_xF_y$ (x being 0 or an integer of 1 or more and y being an integer of 1 or more)
This gas system protects the $SiO_2$ film by forming a deposition phase on the $SiO_2$ film by means of carbon, etches the Si (SiN) by means of $F_y$, and etches the nitriding part of the SiN as $NH_x\uparrow$ by means of $H_x$. Examples of this gas system may include $CF_4$, $CHF_3$, $CH_2F_2$, $CHF_3$, etc. Furthermore, this gas system includes an inflammable gas, such as $CH_3F$, $CH_2F_2$, or the like, but the supply of the inflammable gas has difficulty in a typical supply system.

(3) $NF_xR_y$ (R being hydrocarbon, x being an integer of 1 or more, and y being 0 or an integer of 1 or more)
As in the gas system (2), this gas system protects the $SiO_2$ film by forming a deposition phase on the $SiO_2$ film by means of carbon, etches the Si (SiN) by means of $F_y$, and etches the nitriding part of the SiN as $NH_x\uparrow$ by means of H in the hydrocarbon. Examples of this gas system may include $NF_3$, $NF_2CH_3$, $NF(CH_3)_2$, $NF_2(CH_2CH_3)$, $NH(CH_2CH_3)_2$, $NFCH(CH_3)_2$, etc.

Figure 5:
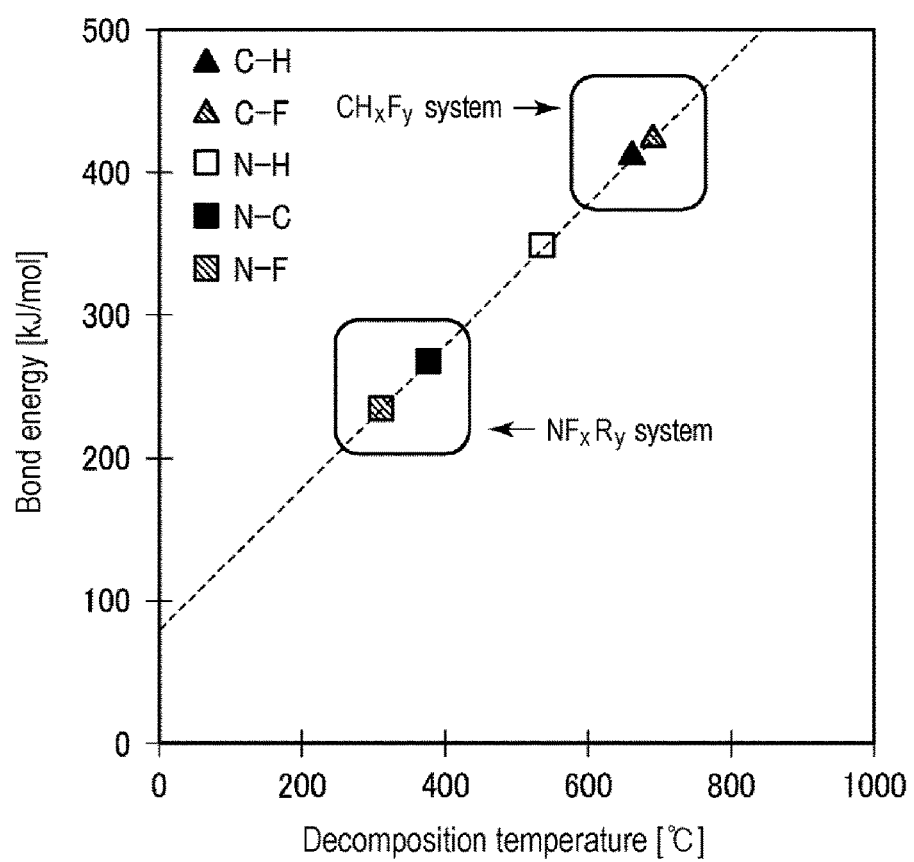
FIG. 5 is a diagram illustrating a result obtained by inferring decomposition temperatures of a $CH_xF_y$ gas and a $NF_xR_y$ gas from bond energies of respective bonds.

Since this gas system has a lower decomposition temperature than the gas system (2), it may be possible to reliably exhibit the function at the film forming temperature of the SiN film. That is, in the gas system (2), the C—H bond and the C—F bond have high bond energies of 414 kJ/mol and 427 kJ/mol, respectively, whereas in the gas system (3), the N—H bond, the N—F bond, and the N—C bond have low bond energies of 351 kJ/mol, 234 kJ/mol, and 268 kJ/mol, respectively. It is known that the Si—H bond and the Si—Si bond in $SiH_4$ and $Si_2H_6$, which are used to form a Si-based film, have bond energies of 314 kJ/mol and 269 kJ/mol and decomposition temperatures of about 470 degrees C. and about 380 degrees C., respectively. On the basis of the result, assuming that a decomposition temperature and bond energy are simply proportional to each other, the decomposition temperatures of the $CH_xF_y$ gas of the gas system (2) and the $NF_xR_y$ gas of the gas system (3) can be inferred as illustrated in FIG. 5. The figure shows that the $CH_xF_y$ gas of the gas system (2) has a decomposition temperature of about 650 degrees C., which exceeds 600 degrees C., and thus active C or F having the above function is less likely to be generated by means of decomposition in the formation of the SiN film, whereas the $NF_xR_y$ gas of the gas system (3) is sufficiently decomposed at about 600 degrees C., which corresponds to the film forming temperature of the SiN film, and thus is more likely to perform the above function.

In the gas system (1) above, a case of requiring the use of multiple gases may occur, which makes it complicated, but it is easy to make the protection of the $SiO_2$ film and the etching of the SiN film compatible by regulating the flow rates of the respective gases.

Figure 6:
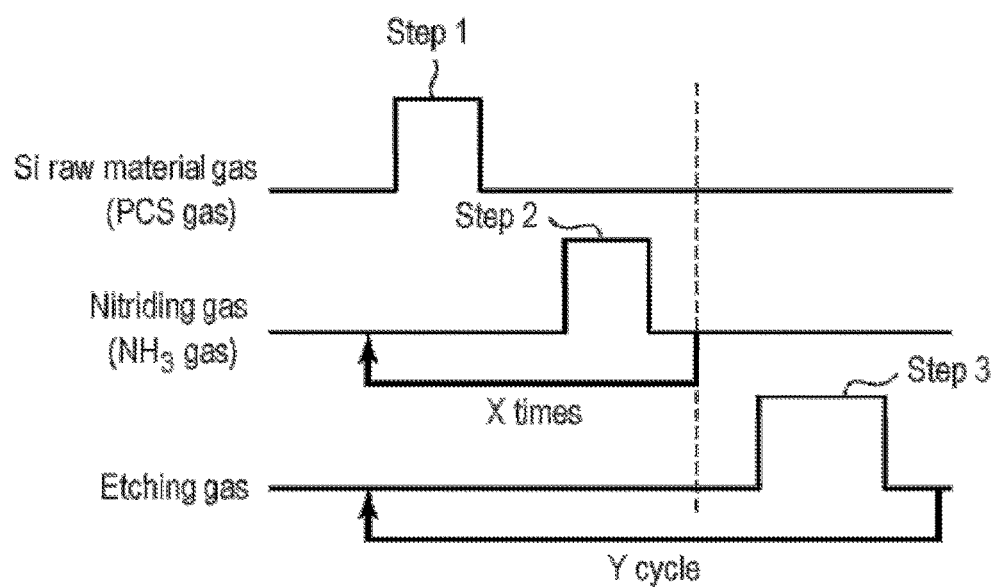
FIG. 6 is a diagram illustrating an example of a gas supply sequence when Steps S2 and S3 in the first embodiment are continuously performed by the same apparatus.

It is preferable to continuously perform Step S2 of forming the SiN film and Step S3 of etching the SiN by the same apparatus. As a result, these processes can be performed with high throughput. In this case, it is preferable to perform Step S2 and Step S3 at the same temperature. The sequence at this time is as illustrated in FIG. 6. That is, after setting the wafer W having the structure illustrated in FIG. 4 within a process chamber of an appropriate processing apparatus, a cycle includes initially repeating the supply of the Si raw material gas (Step S1) and the supply of the nitriding gas (Step S2) a predetermined number of times (X times) and then supplying the etching gas (Step S3). The cycle is performed a predetermined number of cycles (Y cycles). After each step is completed, a process of removing, from the wafer W, the residue of the gas used in the step, for example, a purge process, is performed, as described above.

As described above, according to this embodiment, in the case where two types of base films are present, for example, a $SiO_2$ film and a SiN film are present, in the initial stage of a film-forming process, a SiN film is selectively formed on the SiN film and, when SiN is attached to the $SiO_2$ film in the form of initial nuclei or formed in a thin film shape, the SiN on the $SiO_2$ film is removed by an etching action, so that the surface of the $SiO_2$ film with slow film formation is exposed again. Accordingly, it is possible to selectively form a relatively thick SiN film on the SiN base film, which is one of the base films, by repeating the film formation and the etching.

Second Embodiment

Figure 7:
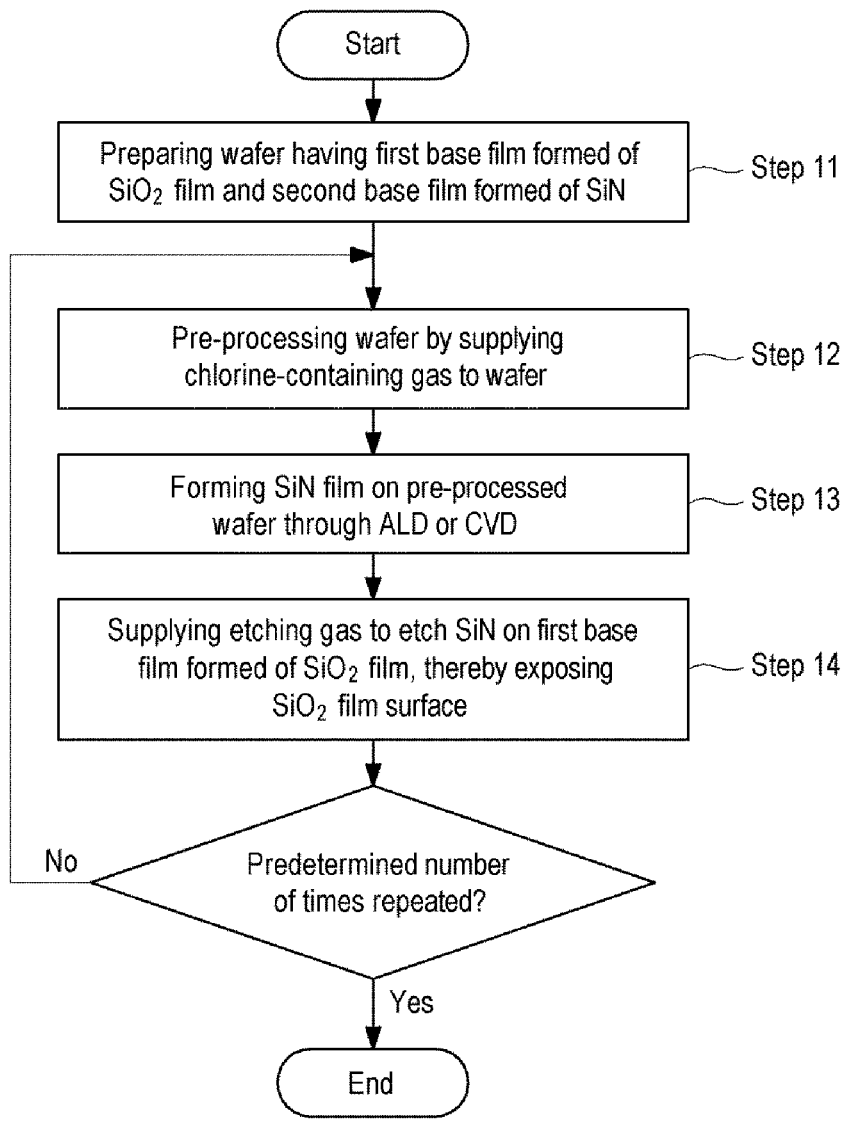
FIG. 7 is a flowchart illustrating a second embodiment of a nitride film forming method.

FIG. 7 is a flowchart illustrating a second embodiment of the nitride film forming method according to the present disclosure.

First, as in Step S1 in the first embodiment, a wafer W in which a first base film 202 and a second base film 203 are formed on a semiconductor substrate 201, as schematically illustrated in FIG. 4, is prepared as a substrate to be processed (Step S11).

The first base film 202 and the second base film 203 have different incubation times when a SiN film is formed thereon. For example, the first base film 202 is a thermal oxide film ($SiO_2$ film), and the second base film 203 is a SiN film.

Next, pre-processing using a chlorine-containing gas is performed on the wafer W in which the base films 202 and 203 are formed (Step S12). The pre-processing is performed to adsorb the chlorine-containing gas onto the base films 202 and 203.

Figure 8:
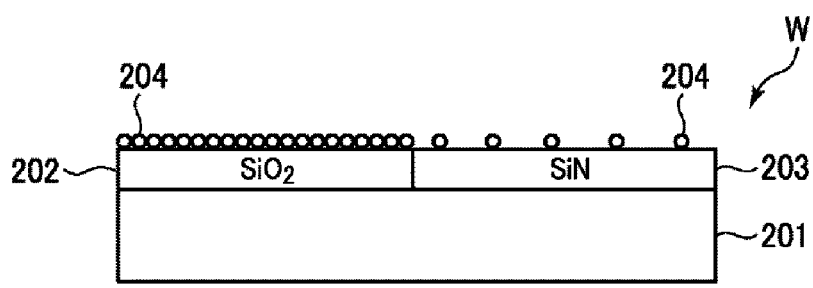
FIG. 8 is a view schematically illustrating the state in which a chlorine-containing gas has been adsorbed onto the substrate of FIG. 4.

The adsorbability (reactivity) of the chlorine-containing gas varies depending on the base films, and when $Cl_2$ is chemisorbed onto $SiO_2$, a reaction of the $SiO_2$ with DCS or $NH_3$ is suppressed. Furthermore, the chlorine-containing gas acts to hinder adsorption of a Si raw material gas that will be used to form a SiN film later. Due to this, a larger amount of chlorine-containing gas 204 is adsorbed onto the first base film 202 formed of a $SiO_2$ film, as illustrated in FIG. 8.

Figure 9:
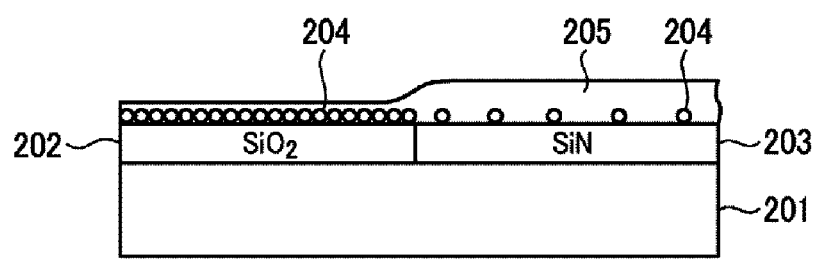
FIG. 9 is a view schematically illustrating a state in which a SiN film has been formed on the substrate of FIG. 8, the substrate having the chlorine-containing gas adsorbed thereon.

Subsequently, the film formation of the SiN film on the pre-processed wafer W by ALD or CVD using a Si raw material gas, for example, a DCS gas, and a nitriding gas, for example, a $NH_3$ gas starts (Step S13). At this time, since incubation time of the second base film 203 formed on the SiN film is shorter than that of the first base film 202 formed of the SiO2 film, the film formation starts earlier on the second base film 203. Furthermore, since a larger amount of chlorine-containing gas has been adsorbed onto the first base film 202 formed of a $SiO_2$ film, it is more difficult to form a film on the first base film 202. Thus, it is possible to form the SiN film 205 on the second base film 203 to have a film thickness thicker than the SiN film 205 on the first base film 202, as illustrated in FIG. 9.

Subsequently, when the film formation starts, the film formation of the SiN film proceeds on the second base film 203 formed of a SiN film, however, when SiN is attached to the first base film 202, which is formed of a $SiO_2$ film, in the form of initial nuclei before the SiN becomes a film or SiN is formed in a thin film shape, an etching gas is supplied to remove the formed SiN by the etching action of the etching gas (Step S14). At this time, the SiN film on the second base film 203 formed of a SiN film is also etched, but it is possible to make the SiN film remain on the second base film 203 since the SiN film is formed thickly on the SiN film. Furthermore, the film thickness of the remaining SiN film on the second base film 203 may be thicker than that in the first embodiment since a reaction of the $SiO_2$ film with DCS or $NH_3$ is suppressed by the chemisorption of the $Cl_2$ and the $SiO_2$ film.

The chlorine-containing gas adsorption step of Step S12, the SiN film forming step of Step S13 and the etching step of Step S14 are repeated, and thus a SiN film having a thickness thicker than that in the first embodiment is selectively formed on the second base film 203.

The temperature in Step S12 may be a temperature in which the chlorine-containing gas can be adsorbed and set to a range of 200 to 800 degrees C. The pressure may range from 0.1 to 100 Torr (13.3 to 13330 Pa). The processing time in Step S12 may preferably range from 60 to 1800 seconds. Examples of a chlorine-containing gas that can be used in Step S12 may include an HCl gas, a $BCl_3$ gas, or the like, in addition to a $Cl_2$ gas. Among these gases, a $Cl_2$ gas having high reactivity is preferable.

The SiN film forming step of Step S13 and the etching step of Step S14 may be performed similarly to respective Steps S2 and S3 in the first embodiment.

Figure 12:
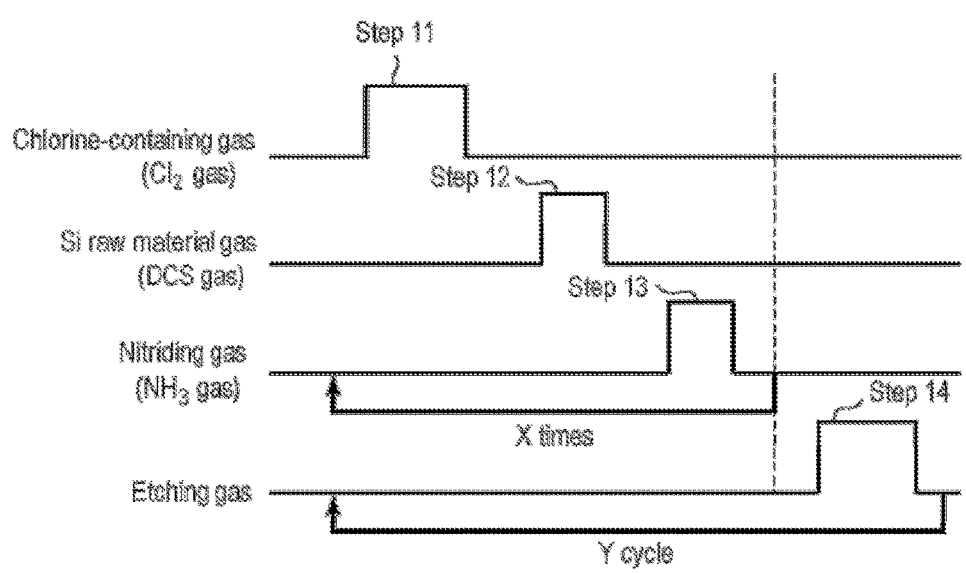
FIG. 12 is a diagram illustrating an example of a gas supply sequence when Steps S12, S13, and S14 in the second embodiment are continuously performed by the same apparatus.

It is preferable to continuously perform Step S12 of performing the pre-processing using the chlorine-containing gas, Step S13 of forming the SiN film and Step S14 of etching the SiN by the same apparatus. As a result, these processes can be performed with high throughput. In this case, it is preferable to perform Steps S12, S13, and S14 at the same temperature. The sequence at this time is as illustrated in FIG. 12. That is, after setting the wafer W having the structure illustrated in FIG. 4 within a process chamber of an appropriate processing apparatus, a cycle includes initially repeating the supply of the chlorine-containing gas (Step S11), the supply of the Si raw material gas (Step S12) and the supply of the nitriding gas (Step S13) a predetermined number of times (X times), and then supplying the etching gas (Step S14), and the cycle is performed a predetermined number of cycles (Y cycles). After each step is completed, a process of removing, from the wafer W, the residue of the gas used in the step, for example, a purge process, is performed, as described above.

Application Example

Hereinafter, an application example of the selective film formation according to the first or second embodiment will be described.

Figure 10A:
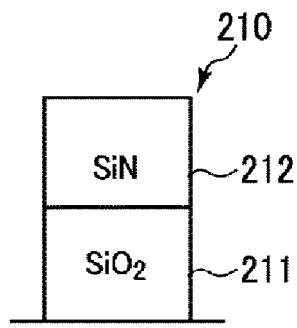
FIGS. 10A to 10C are sectional views schematically illustrating an application example of a nitride film forming method according to the first or second embodiment of the present disclosure.
Figure 10B:
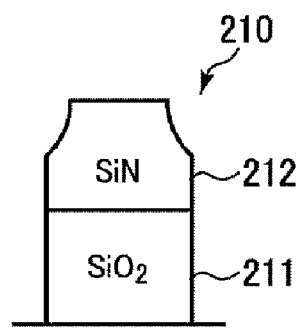
Figure 10C:
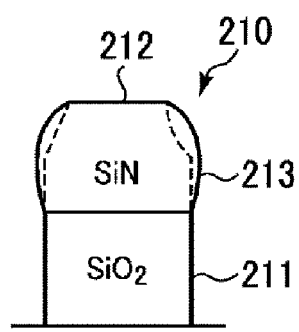

Recently, for example, an etching process margin has become smaller with the miniaturization of devices, and thus an etching error is more likely to occur. For example, in case of forming a stacked structure 210 of a $SiO_2$ film 211 and a SiN film 212 illustrated in FIG. 10A by etching, the SiN film 212 may be superfluously etched more than expected, as illustrated in FIG. 10B. In this case, as illustrated in FIG. 10C, the SiN film 212 may be restored very simply by forming a selective SiN film 213 on the SiN film 212 by means of the selective SiN film forming method according to the present disclosure.

Figure 11A:
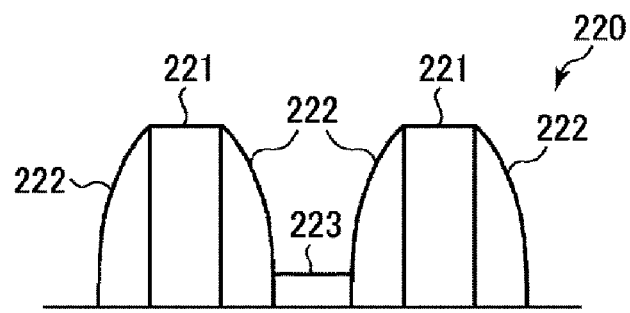
FIGS. 11A to 11C are sectional views schematically illustrating an example of applying a nitride film forming method according to the first or second embodiment of the present disclosure to an actual device.
Figure 11B:
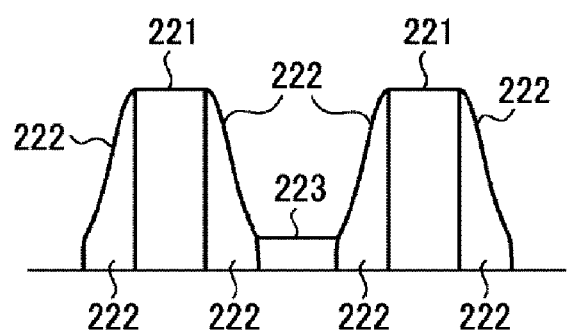
Figure 11C:
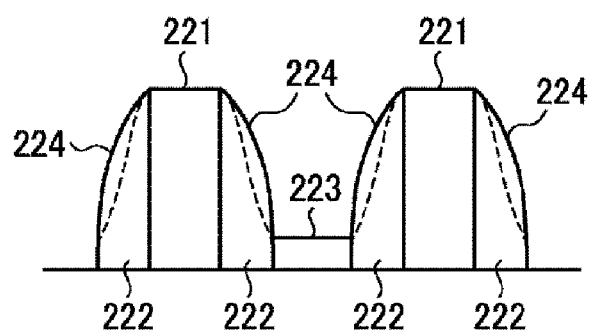

A specific example of forming a structure 220 of FIG. 11A, in which spacers 222 formed of a SiN film are formed on gate electrodes 221 (the detailed structure being omitted), by etching the spacers 222 will be described. In the figure, reference numeral 223 denotes a thermal oxide film. In the case where the spacers 222 are excessively etched, the spacers 222 becomes thinner than expected, as illustrated in FIG. 11B, and thus fail to meet the specification requirement for insulation performance. In this case, it may be very convenient if the spacers 222 can be restored. Thus, the spacers 222 may be restored by forming selective SiN films 224 on the spacers 222 by means of the selective SiN film forming method according to the first or second embodiment, as illustrated in FIG. 11C. The thickness of the SiN film that is to be restored is small, and a SiN film is hardly formed on the thermal oxide film 223. Therefore, after the restoration, just as in the typical case, the thermal oxide film 223 is merely etched, and no additional step other than the selective formation of the SiN film is required.

<Film Forming Apparatus>

Hereinafter, examples of a film forming apparatus for performing the nitride film forming method of the present disclosure will be described.

First Example of Film Forming Apparatus

In this example, the film forming apparatus is exemplified by a vertical batch-type film forming apparatus.

Figure 13:
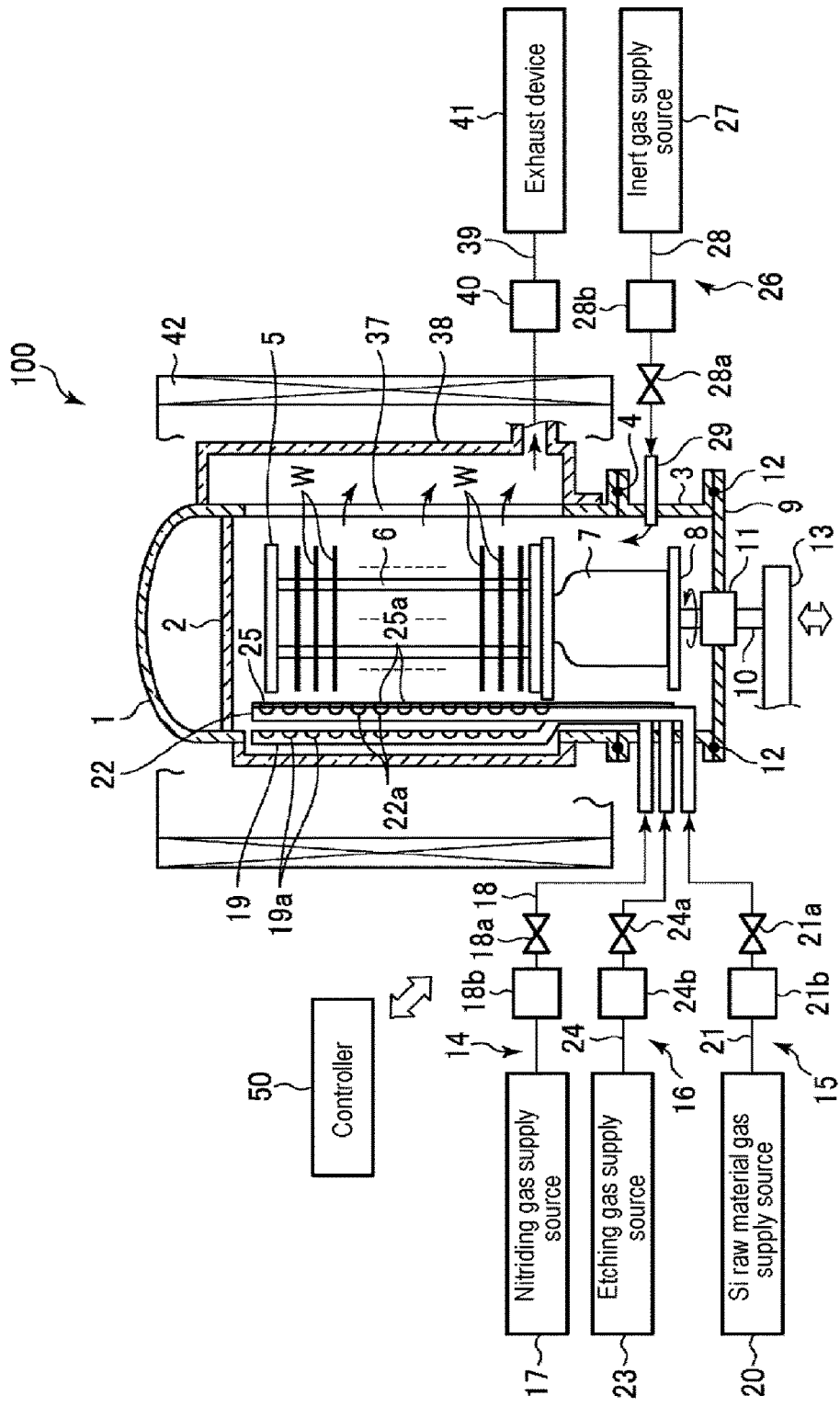
FIG. 13 is a longitudinal sectional view illustrating a first example of a film forming apparatus for performing a nitride film forming method of the present disclosure.
Figure 14:
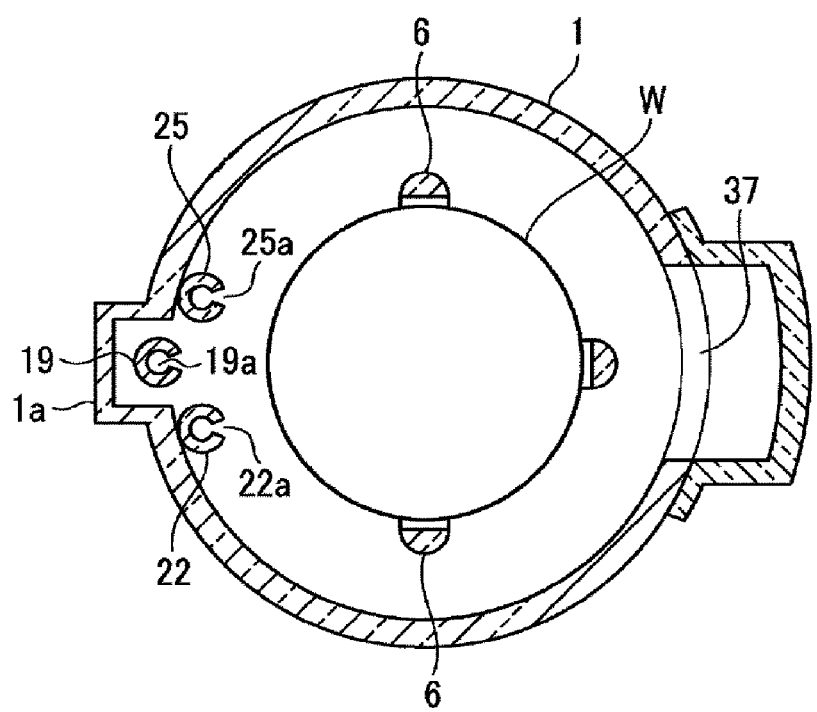
FIG. 14 is a cross sectional view of the film forming apparatus illustrated in FIG. 13.

FIG. 13 is a longitudinal sectional view illustrating the first example of the film forming apparatus for performing the nitride film forming method according to the present disclosure, and FIG. 14 is a horizontally cross-sectional view of the film forming apparatus illustrated in FIG. 13.

The film forming apparatus 100 in this example includes a process chamber 1 having a cylindrical shape with the lower end opened and a ceiling. The entire process chamber 1 is formed of, for example, quartz, and a ceiling plate 2 made of quartz is installed on the ceiling of the process chamber 1 to seal the process chamber 1. As will be described below, the process chamber 1 is configured to be heated by a heating device as a hot wall-type film forming apparatus. Furthermore, a stainless-steel manifold 3 having a cylindrical shape, for example, is connected to the lower opening of the process chamber 1 via a seal member 4, such as an O-ring, etc., therebetween.

The manifold 3 supports the lower end of the process chamber 1, and a wafer boat 5 made of quartz can be inserted into the process chamber 1 from below the manifold 3, wherein a plurality of, for example, 50 to 150 semiconductor wafers W (hereinafter, simply referred to as wafers) as objects to be processed, are stacked in multiple stages within the wafer boat 5. The wafer boat 5 has three pillars 6 (see FIG. 14), and the plurality of wafers W are supported by recesses formed in the pillars 6.

The wafer boat 5 is loaded above a table 8 via a cylindrical heat-insulating cylinder 7 made of quartz therebetween, and the table 8 is supported on a rotary shaft 10 passing through a cover part 9 that opens and closes the lower opening of the manifold 3, the cover part 9 being made of stainless steel, for example.

A magnetic fluid seal 11, for example, is installed in the penetration section of the rotary shaft 10 to rotatably support the rotary shaft 10 while airtightly sealing the rotary shaft 10. Furthermore, a seal member 12 formed of an O-ring, for example, is interposed between the outer peripheral portion of the cover part 9 and the lower end portion of the manifold 3 to thereby maintain the sealing property within the process chamber 1.

The rotary shaft 10 is installed on the front end of an arm 13 supported on a lifting mechanism (not illustrated), for example, a boat elevator, etc., and is configured to integrally lift the wafer boat 5, the cover part 9 and the like to be inserted into the process chamber 1. Also, the table 8 may be fixedly installed on a side of the cover part 9 in order to process the wafers W without rotating the wafer boat 5.

The film forming apparatus 100 includes a nitriding gas supply mechanism 14 configured to supply a nitriding gas, for example, a $NH_3$ gas, into the process chamber 1, a Si raw material gas supply mechanism 15 configured to supply a Si raw material gas, for example, a DCS gas, into the process chamber 1, and an etching gas supply mechanism 16 configured to supply an etching gas into the process chamber 1. Further, the film forming apparatus 100 includes a purge gas supply mechanism 26 configured to supply an inert gas, for example, a $N_2$ gas or an Ar gas, into the process chamber 1 as a purge gas.

The nitriding gas supply mechanism 14 includes a nitriding gas supply source 17, a nitriding gas pipe 18 configured to guide a nitriding gas from the nitriding gas supply source 17, and a nitriding gas dispersion nozzle 19 connected to the nitriding gas pipe 18, the nitriding gas dispersion nozzle 19 being formed of a quartz tube that penetrates the sidewall of the manifold 3 inwardly and is bent upward to vertically extend. A plurality of gas discharge holes 19a are formed in the vertical part of the nitriding gas dispersion nozzle 19 at a predetermined interval to approximately uniformly discharge a nitriding gas toward the process chamber 1 in the horizontal direction.

The Si raw material gas supply mechanism 15 includes a Si raw material gas supply source 20, a Si raw material gas pipe 21 configured to guide a Si raw material gas from the Si raw material gas supply source 20, and a Si raw material gas dispersion nozzle 22 connected to the Si raw material gas pipe 21, the Si raw material gas dispersion nozzle 22 being formed of a quartz tube that penetrates the sidewall of the manifold 3 inwardly and is bent upward to vertically extend. A plurality of gas discharge holes 22a are formed in the Si raw material gas dispersion nozzle 22 at a predetermined interval in the longitudinal direction to approximately uniformly discharge a Si raw material gas into the process chamber 1 in the horizontal direction.

The etching gas supply mechanism 16 includes an etching gas supply source 23, an etching gas pipe 24 configured to guide an etching gas from the etching gas supply source 23, and an etching gas dispersion nozzle 25 connected to the etching gas pipe 24 and installed by penetrating the sidewall of the manifold 3. A plurality of gas discharge holes 25a are formed in the etching gas dispersion nozzle 25 at a predetermined interval in the longitudinal direction to approximately uniformly discharge an etching gas into the process chamber 1 in the horizontal direction.

The inert gas supply mechanism 26 includes an inert gas supply source 27, an inert gas pipe 28 configured to guide an inert gas from the inert gas supply 27, and an inert gas nozzle 29 connected to the inert gas pipe 28 and installed by penetrating the sidewall of the manifold 3.

An opening/closing valve 18a and a flow controller 18b, such as a mass flow controller, are installed on the nitriding gas pipe 18 to supply a nitriding gas while controlling the flow rate thereof. An opening/closing valve 21a and a flow controller 21b are installed on the Si raw material gas pipe 21 to supply a Si raw material gas while controlling the flow rate thereof. An opening/closing valve 24a and a flow controller 24b are installed on the etching gas pipe 24 to supply an etching gas while controlling the flow rate thereof. An opening/closing valve 28a and a flow controller 28b, such as a mass flow controller, are installed on the inert gas pipe 28 to supply an inert gas while controlling the flow rate thereof.

A protruding part 1a is formed on a side surface of the process chamber 1 along the height direction, and the nitriding gas dispersion nozzle 19 is disposed in an inner space of the protruding part 1a, as illustrated in FIG. 14. The Si raw material gas dispersion nozzle 22 and the etching gas dispersion nozzle 25 are arranged such that the nitriding gas dispersion nozzle 19 is interposed therebetween.

A plasma generation mechanism may be installed in the protruding part 1a to turn a nitriding gas into plasma. In case of supplying a chlorine-containing gas as in the second embodiment, a chlorine-containing gas supply mechanism that has a configuration similar to that of the nitriding gas supply mechanism 14, the Si raw material gas supply mechanism 15, or the etching gas supply mechanism 16 may be added.

An exhaust hole 37 for vacuum-exhausting the inside of the process chamber 1 is formed in the sidewall at the opposite side of the protruding part 1a of the process chamber and is narrow and elongated in the vertical direction. An exhaust-hole cover member 38 has a U-shaped cross section and is installed to cover the exhaust hole 37 of the process chamber 1. An exhaust pipe 39 for exhausting the inside of the process chamber 1 through the exhaust hole 37 is connected to a lower portion of the exhaust-hole cover member 38. A pressure control valve 40 configured to control the pressure inside the process chamber 1 and an exhaust device 41 including a vacuum pump and the like are connected to the exhaust pipe 39. Thus, the inside of the process chamber is exhausted by the exhaust device 41 through the exhaust pipe 39 and adjusted to a predetermined depressurized state.

A heating device 42 having a cylindrical shape is installed to surround the process chamber 1 outside the process chamber 1 to heat the process chamber 1 and the wafers W therein.

The film forming apparatus 100 has a controller 50. The controller 50 controls the elements of the film forming apparatus 100, for example, valves, mass flow controllers which are flow controllers, driving mechanisms of lifting mechanisms, etc., heater power supplies, and the like. The controller 50 has a CPU (computer), and has a main control part for performing the control, an input device, an output device, a display device, and a memory device. A storage medium storing a program for controlling the processes executed in the film forming apparatus 100, that is, a processing recipe is set up in the memory device, and the main control part calls a predetermined processing recipe stored in the storage medium to control the film forming apparatus 100 such that a predetermined process can be performed based on the processing recipe by the film forming apparatus 100.

Next, an operation of forming a SiN film by the film forming apparatus 100 configured as above will be described. The following processing operations are performed based on the processing recipe stored in the storage medium of the memory device in the controller 50.

First, a plurality of, for example, 50 to 150 wafers W having two types of base films, for example, a first base film formed of a $SiO_2$ film and a second base film formed of a SiN film, as illustrated in FIG. 4, are mounted in the wafer boat 5. The wafer boat 5 is loaded above the table 8 via the cylindrical heat-insulating cylinder 7 therebetween and then carried into the process chamber 1 through the lower opening thereof by lifting the arm 13 by means of the lifting mechanism.

The inside of the process chamber 1 is adjusted to a pressure of 0.1 to 100 Torr (13.3 to 13330 Pa), and then the opening/closing valve 28a is opened to supply an inert gas, for example, a $N_2$ gas, into the process chamber 1 as a purge gas at a predetermined flow rate to purge the inside of the process chamber 1. In this state, the heating device 42 pre-heats the process chamber 1 such that the temperature of the center portion (center portion in a vertical direction) of the wafer boat 5 becomes a predetermined temperature within a range of, for example, 400 to 650 degrees C.

Thereafter, the opening/closing valve 21a is opened to supply a Si raw material gas, for example, a DCS gas into the process chamber 1 while the purge gas flows, thereby adsorbing the DCS gas onto the wafers W (Step S1 of FIG. 6). After a predetermined period of time, the opening/closing valve 21a is closed, and the inside of the process chamber 1 is purged by the purge gas flowing thereinto. After a predetermined period of time, the opening/closing valve 18a is opened to supply a nitriding gas, for example, a $NH_3$ gas, into the process chamber 1 to perform a nitriding process (Step S2 of FIG. 6). After a predetermined period of time, the opening/closing valve 18a is closed, and the inside of the process chamber 1 is purged by the purge gas flowing thereinto. By repeatedly performing the supply of the DCS gas and the supply of the nitriding gas a predetermined number of times, when a SiN film having a predetermined film thickness is formed on the second base film, which is formed of a SiN film having a short incubation time, SiN is attached to the first base film, which is formed of a $SiO_2$ film having a long incubation time, in the form of initial nuclei before the SiN becomes a film, or SiN is formed in a thin film shape, the opening/closing valve 24a is opened to supply an etching gas into the process chamber 1 while the purge gas flows (Step S3 of FIG. 6), to remove the SiN on the first base film formed of a $SiO_2$ film by the etching action, thereby exposing the surface of the $SiO_2$ film. After a predetermined period of time, the opening/closing valve 24a is closed, and the inside of the process chamber 1 is purged by the purge gas flowing thereinto. A cycle including repeating Steps S1 and S2 a predetermined number of times and then performing Step S3 is repeated a predetermined number of times.

Accordingly, since it is possible to make a state that a thick SiN film is formed on the second base film formed of a SiN film and a SiN film is hardly formed on the first base film formed of a $SiO_2$ film, the selective film formation of the SiN film is realized.

After the SiN film is completely formed, the inside of the process chamber 1 is purged by the purge gas while exhausting the inside of the process chamber 1 through the exhaust pipe 39 by the exhaust device 41. The wafer boat 5 is unloaded from the process chamber 1 by lowering the arm 13 of the lifting mechanism after the pressure inside the process chamber 1 returns to the atmospheric pressure.

Examples of gas supply conditions in the film forming apparatus 100 are as follows:
Flow rate of DCS gas: 500 to 2000 sccm
Flow rate of $NH_3$ gas: 1000 to 10000 sccm
Flow rate of etching gas: 1 to 10000 sccm
Flow rate of $N_2$ gas (purge gas): 50 to 5000 sccm
DCS gas supply time: 3 to 60 sec
$NH_3$ gas supply time: 5 to 60 sec
Etching gas supply time: 10 to 600 sec
Purge time: 1 to 30 sec In addition, the apparatus in the present embodiment may include a chlorine-containing gas supply mechanism. A cycle includes repeating the supply of a chlorine-containing gas (Step S11 of FIG. 12), the supply of a Si raw material gas (Step S12 of FIG. 12) and the supply of a nitriding gas (Step S13 of FIG. 12) a predetermined number of times and then supplying an etching gas (Step S14 of FIG. 12), and the cycle may be repeated a predetermined number of cycles. Furthermore, a Si raw material gas and a $NH_3$ gas may be simultaneously supplied into the process chamber 1 to form a SiN film through CVD.

Second Example of Film Forming Apparatus

In this example, the film forming apparatus is exemplified by a horizontal batch-type film forming apparatus.

Figure 15:
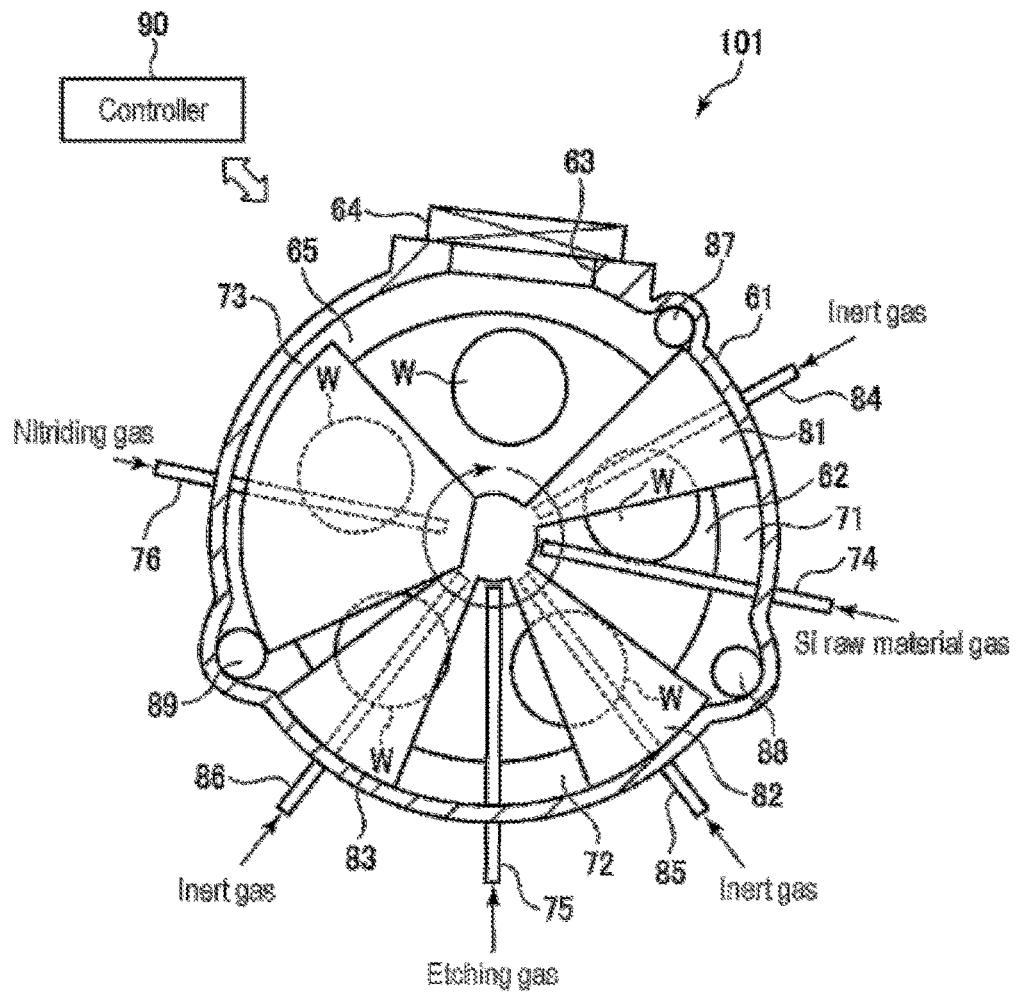
FIG. 15 is a sectional view illustrating a second example of the film forming apparatus for performing a nitride film forming method of the present disclosure.

FIG. 15 is a cross sectional view schematically illustrating the second example of the film forming apparatus for performing the nitride film forming method according to the present disclosure.

The film forming apparatus 101 in this example includes a metal process chamber 61 having a cylindrical shape and is configured to be a cold wall-type film forming apparatus. A turntable 62 on which a plurality of, for example, five wafers W are mounted is installed in the process chamber 61. The turntable 62 rotates, for example, in a clockwise direction.

A loading/unloading port 63 for loading/unloading a wafer W from/to an adjacent transfer chamber (not illustrated) to/from the process chamber 61 is installed in the sidewall of the process chamber 61, and the loading/unloading port 63 is configured to be opened and closed by a gate valve 64.

A portion of the process chamber 61 that corresponds to the loading/unloading port 63 serves as a loading/unloading part 65, and the loading of a wafer W onto the turntable 62 and the unloading of the wafer W from the turntable 62 are performed in the loading/unloading part 65.

The area in the process chamber 61, except for the loading/unloading part 65, is divided into six areas along the rotation area of the turntable 62. That is, the area is divided into a first processing area 71, a second processing area 72 and a third processing area, which are installed in the clockwise direction from the loading/unloading part 65, a first separating area 81 between the loading/unloading part 65 and the first processing area 71, a second separating area 82 between the first processing area 71 and the second processing area 72, and a third separating area 83 between the second processing area 72 and the third processing area 73. As the turntable 62 rotates, the wafers W sequentially pass these six areas. The first to third separating areas 81 to 83 have a function of separating gas atmospheres of the first to third processing areas 71 to 73.

A first process gas nozzle 74, a second process gas nozzle 75 and a third process gas nozzle 76 configured to discharge process gases to the wafers W on the turntable 62 are radially installed in the first processing area 71, the second processing area 72 and the third processing area 73, respectively, in the radial direction of the process chamber 61.

A first inert gas nozzle 84, a second inert gas nozzle 85 and a third inert gas nozzle 86 configured to discharge an inert gas, for example, a $N_2$ gas, to the wafers W on the turntable 62 are radially installed in the first separating area 81, the second separating area 82 and the third separating area 83 in the radial direction of the process chamber 61. The gas atmospheres are separated from one another by the inert gas discharged from these nozzles.

Three exhaust holes 87, 88, and 89 are formed at the lower portion of the process chamber 61. The inside of the process chamber 61 are exhausted through the exhaust holes 87, 88, and 89.

In the film forming apparatus 101, a Si raw material gas, for example, a DCS gas, is supplied into the process chamber 61 through the first process gas nozzle 74, an etching gas is supplied into the process chamber 61 through the second process gas nozzle 75, and a nitriding gas, for example, a $NH_3$ gas, is supplied into the process chamber 61 through the third process gas nozzle 76. Accordingly, the first processing area 71 serves as a Si raw material gas supply area, the second processing area serves as an etching gas supply area, and the third processing area 73 serves as a nitriding area. Furthermore, a plasma generation mechanism may be installed in the third processing area 73 to turn the nitriding gas into plasma. In addition, a plasma generation mechanism may be installed in the second processing area 72 to turn the etching gas into plasma.

The film forming apparatus 101 has a control part 90. The controller 90 has the same configuration as the controller 50 of the film forming apparatus 100 in the first example.

While details of a Si raw material gas supply mechanism, an etching gas supply mechanism, a nitriding gas supply mechanism, and an inert gas supply mechanism are omitted in FIG. 15, these gas supply mechanisms are configured similarly to those of the film forming apparatus 100. Furthermore, a heating device (not illustrated) is installed in the turntable 62. In addition, exhaust pipes (not illustrated) are connected to the exhaust holes 87, 88, and 89, and a pressure control valve (not illustrated) and an exhaust device (not illustrated) having a vacuum pump are installed on the exhaust pipes.

In the film forming apparatus 101, the method of forming the SiN film according to the embodiments of the present disclosure is realized by the control of the control part 90.

First, the gate valve 64 is opened, and a plurality of, for example, five wafers W are sequentially loaded into the process chamber 61 from the adjacent transfer chamber (not illustrated) through the loading/unloading port 63 by a transfer device (not illustrated), each of the wafers W having two types of base films, for example, a first base film formed of a $SiO_2$ film and a second base film formed of a SiN film, as illustrated in FIG. 4. The inside of the process chamber 61 is adjusted to a pressure of 0.1 to 5 Torr (13.3 to 667 Pa) by an exhaust mechanism. At this time, the turntable 62 is pre-heated such that the wafers W are heated to a predetermined temperature of 400 to 650 degrees C.

Next, at a state that an inert gas, for example, a $N_2$ gas, is discharged from the first to third inert gas nozzles 84 to 86, the turntable 62 is rotated, a Si raw material gas, for example, a DCS gas, is discharged from the first process gas nozzle 74, and a nitriding gas, for example, a $NH_3$ gas, is discharged from the third process gas nozzle 76.

At this time, the wafers W sequentially pass the first processing area 71, the second separating area 82, the second processing area 72, the third separating area 83, the third processing area 73, and the first separating area 81. The DCS gas is adsorbed onto the wafers W for the first time in the first processing area 71 (Step S1 of FIG. 6), the DCS gas remaining on the wafers W is removed by the $N_2$ gas in the second separating area 82, a nitriding process is performed on the wafers W using the $NH_3$ gas in the third processing area 73 (Step S2 of FIG. 6), and the $NH_3$ gas remaining on the wafers W is removed by the $N_2$ gas in the first separating area 81. One cycle of ALD is performed within one revolution of the turntable 62, and the turntable 62 is rotated a predetermined number of times. When a SiN film having a predetermined film thickness is formed on the second base film which is formed of a SiN film having a short incubation time, and SiN is attached to the first base film, which is formed of a $SiO_2$ film having a long incubation time, in the form of an initial nuclei prior to becoming the SiN film or SiN is formed in a thin film shape, the supply of the DCS gas and the $NH_3$ gas is stopped. And then, an etching gas is supplied into the process chamber 61 through the second process gas nozzle 75 while rotating the turntable 62 (Step S3 of FIG. 6), to remove the SiN on the first base film formed of a $SiO_2$ film by the etching action, thereby exposing the surface of the $SiO_2$ film. A cycle includes performing Steps S1 and S2 a predetermined number of times by supplying the DCS gas and the $NH_3$ gas, and then performing Step S3 while rotating the turntable 62, and the cycle is repeated a predetermined number of cycles.

Accordingly, a thick SiN film is formed on the second base film formed of a SiN film, and a SiN film is hardly formed on the first base film formed of a $SiO_2$ film. As a result, the selective film formation of the SiN film is realized.

After the SiN film is completely formed, the inside of the process chamber 61 is purged by supplying an inert gas through the first to third inert gas nozzles 84 to 86 while exhausting the inside of the process chamber 61 by means of the exhaust device. The inside of the process chamber 1 is adjusted to the same pressure as that in the transfer chamber, the gate valve 64 is opened, and the wafers W are sequentially unloaded from the process chamber 61 through the loading/unloading port 63 by the transfer device.

Examples of gas supply conditions in the film forming apparatus 101 are as follows:

Flow rate of DCS gas: 500 to 2000 sccm
Flow rate of $NH_3$ gas: 1000 to 10000 sccm
Flow rate of etching gas: 10 to 10000 sccm
Flow rate of $N_2$ gas (inert gas): 50 to 10000 sccm In addition, the film forming apparatus in the present embodiment merely forms a SiN film by ALD rather than CVD. Furthermore, a processing area and a separating area may be further added, and a process gas nozzle may be installed to supply a chlorine-containing gas to the additional processing area. A cycle includes repeating the supply of a chlorine-containing gas (Step S11 of FIG. 12), the supply of a Si raw material gas (Step S12 of FIG. 12), and the supply of a nitriding gas (Step S13 of FIG. 12) a predetermined number of times, and then supplying an etching gas (Step S14 of FIG. 12) while rotating the turntable 62, and the cycle may be performed a predetermined number of cycles.

Third Example of Film Forming Apparatus

In this example, the film forming apparatus is exemplified by a single wafer processing-type film forming apparatus.

Figure 16:
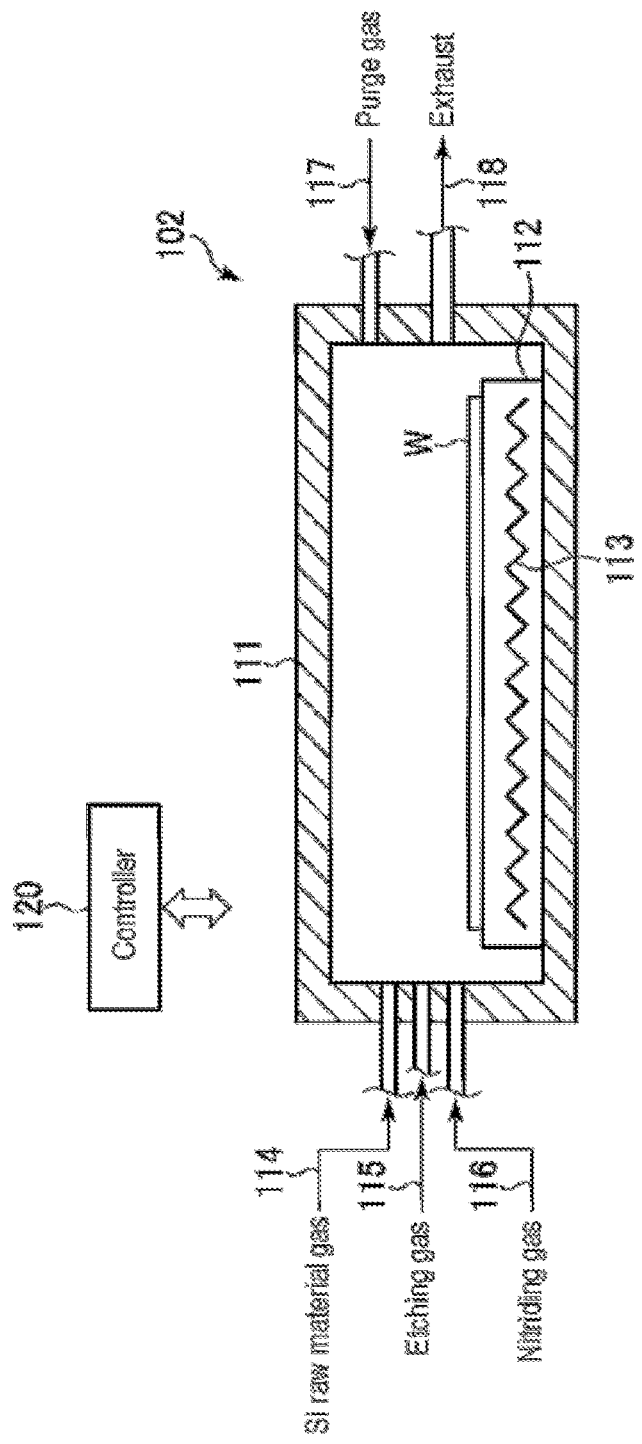
FIG. 16 is a sectional view illustrating a third example of the film forming apparatus for performing a nitride film forming method of the present disclosure.

FIG. 16 is a horizontal cross sectional view schematically illustrating the third example of the film forming apparatus for performing the nitride film forming method according to the present disclosure.

The film forming apparatus 102 in this example includes a metal process chamber 111 having a cylindrical shape and is configured to be a cold wall-type film forming apparatus. A substrate mounting table 112 is installed at a lower portion of the process chamber 111, and a wafer W as a substrate to be processed is mounted on the substrate mounting table 112. A heater 113 is installed in the substrate mounting table 112.

A Si raw material gas pipe 114 configured to introduce a Si raw material gas, for example, a DCS gas, into the process chamber 111, an etching gas pipe 115 configured to introduce an etching gas into the process chamber 111, and a nitriding gas pipe 116 configured to introduce a nitriding gas, for example, a $NH_3$ gas, into the process chamber 111 are connected adjacently to a predetermined portion of the sidewall of the process chamber 111.

A purge gas pipe 117 configured to supply an inert gas, for example, a $N_2$ gas, as a purge gas and an exhaust pipe 118 configured to exhaust gas in the process chamber 111 are connected to the sidewall of the process chamber 111, which is opposite to the portion to which the Si raw material gas pipe 114 and the like is connected.

An appropriate plasma generation mechanism may be installed to turn a nitriding gas and/or an etching gas into plasma.

The film forming apparatus 102 has a controller 120. The controller 120 has the same configuration as the controller 50 of the film forming apparatus 100 in the first example.

While details of a Si raw material gas supply mechanism, an etching gas supply mechanism, a nitriding gas supply mechanism, and an inert gas supply mechanism are omitted in FIG. 16, these gas supply mechanisms are configured similarly to those of the film forming apparatus 100. Furthermore, a pressure control valve and an exhaust device (not illustrated) having a vacuum pump are installed on the exhaust pipe.

In the film forming apparatus 102, the method of forming the SiN film according to the embodiments of the present disclosure is realized by the control of the control part 120.

First, a gate valve is opened, and one wafer W is loaded into the process chamber 111 from an adjacent transfer chamber through an loading/unloading port by a transfer device (not illustrated), and is mounted on the substrate mounting table 112, each of the wafer W having two types of base films, for example, a first base film formed of a SiO$_2$ film and a second base film formed of a SiN film, as illustrated in FIG. 4. The inside of the process chamber 111 is adjusted to a pressure of 0.1 to 5 Torr (13.3 to 667 Pa) by an exhaust mechanism. At this time, the substrate mounting table 112 is pre-heated by the heater 113 such that the wafer W is heated to a predetermined temperature of 400 to 650 degrees C.

Thereafter, a Si raw material gas, for example, a DCS gas, is supplied into the process chamber 111 while a purge gas, for example, a N$_2$ gas, flows, and the DCS gas is adsorbed onto the wafer W (Step S1 of FIG. 6). After a predetermined period of time, the supply of the DCS gas is stopped, and the inside of the process chamber 111 is purged by the purge gas flowing thereinto. After a predetermined period of time, a nitriding gas (for example, a NH$_3$ gas) is supplied into the process chamber 111 to perform a nitriding process (Step S2 of FIG. 6). After a predetermined period of time, the supply of the NH$_3$ gas is stopped, and the inside of the process chamber 111 is purged by the purge gas flowing. By repeatedly performing the supply of the DCS gas and the supply of the nitriding gas a predetermined number of times, when a SiN film having a predetermined film thickness is formed on the second base film, which is formed of a SiN film having a short incubation time, and SiN is attached to the first base film, which is formed of a SiO$_2$ film having a long incubation time, in the form of an initial nuclei prior to becoming the SiN film or SiN is formed in a thin film shape, an etching gas is supplied into the process chamber 111 while the purge gas flows (Step S3 of FIG. 6), to remove the SiN on the first base film formed of a SiO$_2$ film by the etching action, thereby exposing the surface of the SiO$_2$ film. After a predetermined period of time, the supply of the etching gas is stopped, and the inside of the process chamber 111 is purged by the purge gas flowing thereinto. A cycle includes repeating Steps S1 and S2 a predetermined number of times and then performing Step S3, and the cycle is repeated a predetermined number of cycles.

Accordingly, since it is possible to make a state that a thick SiN film is formed on the second base film formed of a SiN film, and a SiN film is hardly formed on the first base film formed of a SiO$_2$ film, the selective film formation of the SiN film is realized.

After the SiN film is completely formed, the inside of the process chamber 111 is purged by the purge gas while exhausting the inside of the process chamber 111 through the exhaust pipe 118 by the exhaust mechanism. And so, the inside of the process chamber 111 is adjusted to the same pressure as that in the transfer chamber, the gate valve is opened, and the wafer W is unloaded from the process chamber 111 through the loading/unloading port.

Examples of gas supply conditions in the film forming apparatus 102 are as follows:
Flow rate of DCS gas: 10 to 2000 sccm
Flow rate of NH$_3$ gas: 1000 to 5000 sccm
Flow rate of etching gas: 1 to 10000 sccm
Flow rate of N$_2$ gas (purge gas): 50 to 5000 sccm
DCS gas supply time: 0.1 to 60 sec
NH$_3$ gas supply time: 0.1 to 60 sec
Etching gas supply time: 10 to 600 sec
Purge time: 0.1 to 60 sec In addition, the apparatus in the present embodiment may include a chlorine-containing gas supply mechanism. A cycle includes repeating the supply of a chlorine-containing gas (Step S11 of FIG. 12), the supply of a Si raw material gas (Step S12 of FIG. 12), and the supply of a nitriding gas (Step S13 of FIG. 12) a predetermined number of times and then supplying an etching gas (Step S14 of FIG. 12), and the cycle may be repeated a predetermined number of cycles. Furthermore, a Si raw material gas and a NH$_3$ gas may be simultaneously supplied into the process chamber 111 to form a SiN film through CVD.

<Other Applications>

While the embodiments of the present disclosure have been described above, the present disclosure is not limited to the above-described embodiments, and various modifications or variations can be made without departing from the spirit and scope of the present disclosure.

For example, in the above-described embodiments, it has been exemplified that a silicon nitride film is formed using a Si raw material gas and a nitriding gas. However, the embodiments may not be limited thereto and the present disclosure may also be applied to a case of forming a different nitride film using a raw material gas and a nitriding gas. For example, the present disclosure may be applied to various types of nitride films, such as a case of forming a TiN film using a Ti raw material, a case of forming a BN film using a B raw material, a case of forming a WN film using a W raw material, and the like.

In the above-described embodiments, although it has been exemplified that a substrate having a SiO$_2$ film and a SiN film as base films is used, any substrate having two or more types of base films with different incubation times for a silicon nitride film can be applicable. For example, one base film may be formed of an oxide film other than a SiO$_2$ film and the other base film may be formed of a nitride film other than a SiN film, or other films rather than a combination of an oxide film and a nitride film may be applicable for the base films.

Furthermore, if an etching gas has an etching selectivity that is easy to etch a nitride film but is difficult to etch a base film which the film formation of a nitride film is not desired, any etching gas may be applicable, and an etching gas is not limited to the etching gas as illustrated in the above-described embodiments.

Moreover, although the vertical batch-type film forming apparatus, the horizontal batch-type film forming apparatus, and the single wafer processing-type film forming apparatus have been illustrated as typical examples of the film forming apparatus, if the film forming apparatus is capable of realizing the nitride film forming method of the present disclosure, the film forming apparatus may not be limited thereto.

Also, although the substrate to be processed is exemplified by a semiconductor wafer in the above-described embodiments, the substrate may not be limited thereto and it is apparent that other substrates, such as a glass substrate of a flat panel display, a ceramic substrate, and the like, can be applicable.

In the present disclosure, with respect to a substrate that has a first base film formed of a material having a relatively long incubation time for a nitride film, and a second base film formed of a material having a relatively short incubation time, a step of forming a nitride film through ALD or CVD using a raw material gas and a nitriding gas and a step of exposing the film surface of the first base film by supplying an etching gas to etching the nitride on the first base film to be removed are repeatedly performed. Accordingly, it is possible to suppress the formation of a nitride film on the first base film and to selectively form a nitride film on the second base film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method for forming a nitride film, the method comprising:
   a first process of preparing a substrate to be processed, the substrate having a first base film formed of a material having a relatively long incubation time and a second base film formed of a material having a relatively short incubation time with respect to a nitride film;
   a second process of forming a nitride film on the substrate by means of ALD or CVD using a raw material gas and a nitriding gas while heating the substrate to a predetermined temperature; and
   a third process of etching and removing nitride formed on the first base film by supplying an etching gas, thereby exposing a film surface of the first base film,
   wherein the second process and the third process are repeatedly performed a predetermined number of times to selectively form the nitride film on the second base film.

2. The method of claim 1, wherein when the second process is performed by means of the ALD, the raw material gas is initially supplied.

3. The method of claim 1, wherein the etching gas is a gas that is relatively easy to etch the nitride film and is relatively difficult to etch the first base film.

4. The method of claim 1, further comprising after the first process and prior to the second process, a fourth process of performing pre-processing by supplying a chlorine-containing gas while heating the substrate to a predetermined temperature, to adsorb the chlorine-containing gas onto surfaces of the first base film and the second base film,
   wherein the fourth process, the second process and the third process are repeated a predetermined number of times to selectively form the nitride film on the second base film.

5. The method of claim 4, wherein the chlorine-containing gas used in the fourth process is at least one selected from a $Cl_2$ gas, a HCl gas and a $BCl_3$ gas.

6. The method of claim 1, wherein the first base film is a silicon oxide film, the second base film is a silicon nitride film, and the nitride film formed on the first and second base films is a silicon nitride film.

7. The method of claim 6, wherein a Si raw material gas used to form the silicon nitride film is one of a dichloro silane, a monochloro silane, a trichloro silane, a silicon tetrachloride, a hexachloro disilane, a monosilane, a disilane, or an organosilane-based compound.

8. The method of claim 6, wherein the etching gas comprises a fluorine gas and an oxidizing gas.

9. The method of claim 8, wherein the etching gas further comprises at least one of a hydrogen fluoride gas or a hydrocarbon-based compound gas.

10. The method of claim 6, wherein the etching gas is a gas denoted by $CH_xF_y$ (x being 0 or an integer of 1 or more, and y being an integer of 1 or more).

11. The method of claim 6, wherein the etching gas is a gas denoted by $NF_xR_y$ (R being hydrocarbon, x being an integer of 1 or more, and y being 0 or an integer of 1 or more).

12. The method of claim 6, wherein the second process is performed at a temperature of 400 to 650 degrees C. in the case of the ALD and at a temperature of 600 to 800 degrees C. in the case of the CVD.

13. The method of claim 1, wherein the second process and the third process are continuously performed in the same apparatus.

14. The method of claim 13, wherein the second process and the third process are performed at the same temperature.

15. The method of claim 1, wherein the nitriding gas used in the second process is an ammonia gas, a hydrazine gas, or a derivative gas of hydrazine.

16. A non-transitory storage medium storing a program executed in a computer and for controlling an apparatus for forming a nitride film,
   wherein the program is executed to control the apparatus for forming the nitride film to perform the method of forming the nitride film of claim 1.

17. An apparatus for selectively forming a nitride film on a second base film of a substrate to be processed, the substrate having a first base film formed of a material having a relatively long incubation time and the second base film formed of a material having a relatively short incubation time with respect to the nitride film, the apparatus comprising:
   a process chamber in which the substrate is accommodated;
   a gas supply mechanism which supplies a raw material gas, a nitriding gas, and an etching gas into the process chamber, and a heating device that heats a plurality of substrates accommodated in the process chamber;
   an exhaust device which exhausts an inside of the process chamber; and
   a controller that performs a control for a first process of disposing the substrate within the process chamber, a second process of forming the nitride film on the substrate by means of ALD or CVD by supplying a raw material gas and a nitriding gas into the process chamber while heating the substrate to a predetermined temperature, subsequently a third process of etching and removing nitride formed on the first base film by supplying the etching gas to thereby expose a film surface of the first base film, and a fourth process of repeating the second process and the third process a predetermined number of times.

18. The apparatus of claim 17, wherein the first base film is a silicon oxide film, the second base film is a silicon nitride film, and the nitride film formed on the first and second base films is a silicon nitride film.

19. The apparatus of claim 18, wherein a Si raw material gas used to form the silicon nitride film is one of a dichloro silane, a monochloro silane, a trichloro silane, a silicon tetrachloride, a hexachloro disilane, a monosilane, a disilane, or an organosilane-based compound.

20. The apparatus of claim 18, wherein the etching gas comprises a fluorine gas and an oxidizing gas.

21. The apparatus of claim 20, wherein the etching gas further comprises at least one of a hydrogen fluoride gas or a hydrocarbon-based compound gas.

22. The apparatus of claim 18, wherein the etching gas is a gas denoted by $CH_xF_y$ (x being 0 or an integer of 1 or more, and y being an integer of 1 or more).

23. The apparatus of claim 18, wherein the etching gas is a gas denoted by $NF_xR_y$ (R being hydrocarbon, x being an integer of 1 or more, and y being 0 or an integer of 1 or more).

24. The apparatus of claim 17, wherein the nitriding gas used in the second process is an ammonia gas, a hydrazine gas, or a derivative gas of hydrazine.

* * * * *